(12) United States Patent
Kim et al.

(10) Patent No.: US 8,570,094 B2
(45) Date of Patent: Oct. 29, 2013

(54) SEMICONDUCTOR INTEGRATED CIRCUIT AND METHOD FOR DRIVING THE SAME

(75) Inventors: Yeon-Uk Kim, Gyeonggi-do (KR); Jung-Taek You, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 71 days.

(21) Appl. No.: 13/286,462

(22) Filed: Nov. 1, 2011

(65) Prior Publication Data

US 2013/0027095 A1   Jan. 31, 2013

(30) Foreign Application Priority Data

Jul. 26, 2011   (KR) .................. 10-2011-0074199

(51) Int. Cl.
*H01H 37/76* (2006.01)
(52) U.S. Cl.
USPC .......................................... 327/525
(58) Field of Classification Search
USPC .............................. 327/524, 525
See application file for complete search history.

(56) References Cited

U.S. PATENT DOCUMENTS

| | | | | |
|---|---|---|---|---|
| 7,031,218 B2 * | 4/2006 | Hoffmann et al. | .......... | 365/225.7 |
| 7,071,729 B2 * | 7/2006 | Hoffmann | .......... | 326/38 |
| 7,254,079 B2 * | 8/2007 | Sumi et al. | .......... | 365/225.7 |
| 7,397,720 B2 * | 7/2008 | Sumi et al. | .......... | 365/225.7 |
| 7,622,982 B2 * | 11/2009 | Nishihara et al. | .......... | 327/525 |
| 8,278,990 B2 * | 10/2012 | Matsuo | .......... | 327/525 |
| 8,368,456 B2 * | 2/2013 | Kim | .......... | 327/525 |

FOREIGN PATENT DOCUMENTS

| | | |
|---|---|---|
| KR | 1020040007904 | 1/2004 |
| KR | 1020080034848 | 4/2008 |
| KR | 1020100014560 | 2/2010 |

\* cited by examiner

*Primary Examiner* — Jeffrey Zweizig
(74) *Attorney, Agent, or Firm* — IP & T Group LLP

(57) ABSTRACT

A semiconductor integrated circuit includes a command generating unit configured to generate a plurality of second commands in response to a first command, each second command for indicating an operation sections of a corresponding anti-fuse circuit, and a plurality of anti-fuse circuits, each comprising an anti-fuse and configured to receives a corresponding second command and perform a rupture operation of the anti-fuse in response to the received corresponding second command.

16 Claims, 3 Drawing Sheets

SEMICONDUCTOR INTEGRATED CIRCUIT AND METHOD FOR DRIVING THE SAME

CROSS-REFERENCE TO RELATED APPLICATIONS

The present invention claims priority of Korean patent application number 10-2011-0074199, filed on Jul. 26, 2011, which is incorporated by reference in its entirety.

BACKGROUND OF THE INVENTION

Exemplary embodiments of the present invention relate to a semiconductor design technology, and more particularly, to a semiconductor integrated circuit and a method for driving the same.

In general, a semiconductor integrated circuit is provided with a redundancy memory cell in addition and performs a repair operation for replacing a defective memory cell with the redundancy memory cell in order to achieve a high yield. The repair operation may be performed by a fuse circuit. For example, the repair operation may be performed by using a method of cutting a fuse by flowing over-current to the fuse, blowing out a fuse by using a laser beam, connecting a cut fuse by using a laser beam, or programming a fuse by using an erasable programmable read only memory (EPROM). Here, the method of blowing out the fuse by using the laser beam is widely used since it may be simple and have much reliability in blowing out the fuse.

However, the method of blowing out the fuse by using the laser beam may be performed only in a wafer state before a semiconductor memory device is packaged. Thus, a method of using an anti-type fuse (Hereinafter, referred to as an 'anti-fuse') has been introduced.

The method of using the anti-fuse may be used to replace a defective memory cell with a redundancy memory cell in a package state. For reference, the anti-fuse has an electrical characteristic opposite to the fuse. In detail, the anti-fuse is a kind of resistive element to have a high resistance, higher than or equal to 100 MΩ, in an un-programmed state and to have a low resistance lower than 100 KΩ in a programmed state. That is, when the anti-fuse is implemented with a transistor whose source and drain are electrically connected, the anti-fuse may serve as a capacitor in the un-programmed state and a resistor in the programmed state.

The anti-fuse, as a thin insulation material, may include two conductive layers and an insulation layer therebetween. Here, the insulation layer may include a silicon oxide ($SiO_2$), silicon nitride (SiN), tantalum oxide ($TaO_x$), or silicon dioxide-silicon nitride-silicon dioxide (ONO). A program operation on the anti-fuse is performed by applying a high voltage, e.g., approximately 10 V, to two conductive layers of the anti-fuse, thereby breaking down the insulating properties of the insulation layer therebetween. Accordingly, when the anti-fuse is programmed, two terminals coupled to the two conductive layers of the anti-fuse are short so that the anti-fuse has a low resistance.

However, when a program operation is performed on a plurality of anti-fuses, some of the anti-fuses may not be programmed. This is because it is difficult to manufacture all the anti-fuses to have an identical characteristic. Thus, even if the plurality of anti-fuses is simultaneously programmed, some of the anti-fuses may be ruptured before the others are programmed. At this time, a path of leakage current is formed from a high supply voltage terminal to a low supply voltage terminal, and thus, a voltage level of the high supply voltage terminal may drop.

Furthermore, whenever any of the plurality of anti-fuses is ruptured, the voltage level of the high supply voltage terminal may drop more seriously. If the voltage level of the high supply voltage terminal drops below a rupture tolerance range, the program operation may end in the state that some anti-fuses may not be programmed. For reference, since a high supply voltage is generally generated inside a semiconductor integrated circuit, there may be a limit in maintaining the voltage level of the high supply voltage terminal at a target voltage level when the high supply voltage is used at the same time.

As a result, when a program operation is performed on a plurality of anti-fuses, there may be some anti-fuses whose program operation is not properly performed due to a path of leakage current formed between a high supply voltage terminal and a low supply voltage terminal.

SUMMARY OF THE INVENTION

Exemplary embodiments of the present invention are directed to a semiconductor integrated circuit and a method for driving the same capable of stably supplying a program voltage when a plurality of anti-fuses is programmed at once.

In accordance with an exemplary embodiment of the present invention, a semiconductor integrated circuit includes a command generating unit configured to generate a plurality of second commands in response to a first command, each second command for indicating an operation section of a corresponding anti-fuse circuit and a plurality of anti-fuse circuits, each comprising an anti-fuse and configured to receive a corresponding second command and perform a rupture operation of the anti-fuse in response to the received corresponding second command.

In accordance with another exemplary embodiment of the present invention, a method for driving a semiconductor integrated circuit includes generating a rupture source signal in response to a reset signal and a first rupture command sequentially generating a plurality of second rupture commands in response to the first rupture command and the rupture source signal each indicating an operation section for programming a corresponding anti-fuse, and programming the corresponding anti-fuse in response to each of the second rupture commands.

DESCRIPTION OF SPECIFIC EMBODIMENTS

Figure 1:
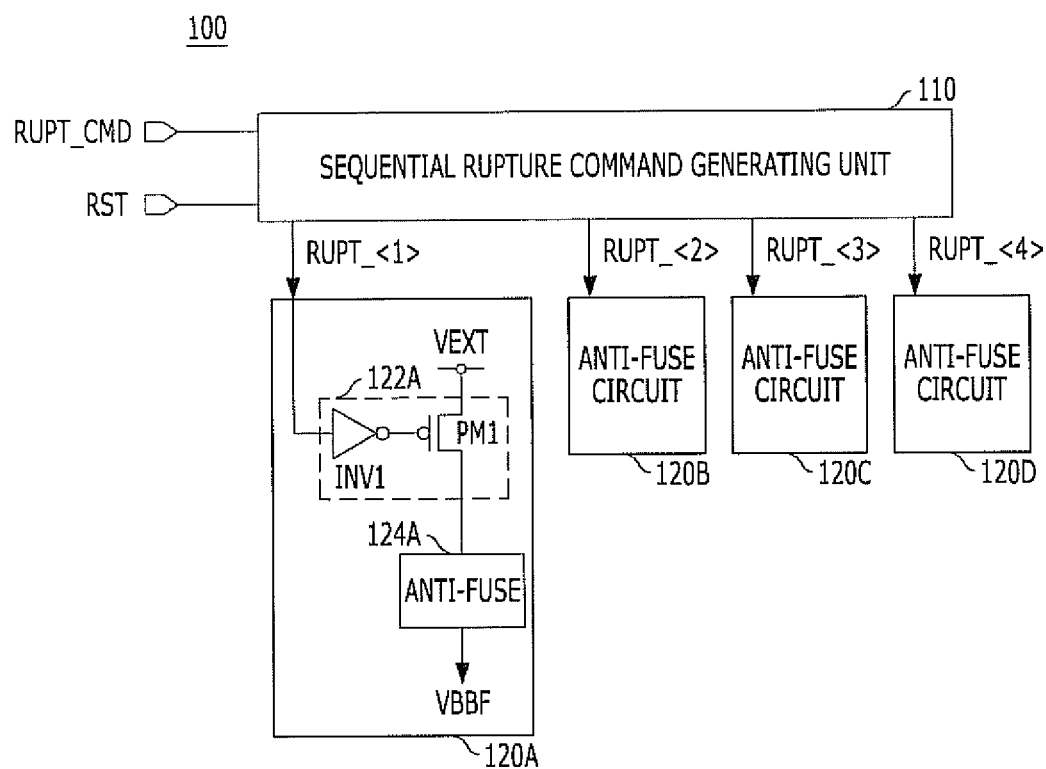
FIG. 1 shows a block diagram of a semiconductor integrated circuit including an anti-fuse circuit in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 shows a block diagram of a semiconductor integrated circuit including an anti-fuse circuit in accordance with an embodiment of the present invention.

For example, 4 anti-fuses are provided in a semiconductor integrated circuit in the preferred embodiment.

Referring to FIG. 1, a semiconductor integrated circuit 100 includes a sequential rupture command generating unit 110 and first to fourth anti-fuse circuits 120A, 120B, 120C, and 120D. The sequential rupture command generating unit 110 is configured to generate first to fourth sequential rupture commands RUPT_<1:4>, each indicating a section for a rupture operation of each anti-fuse circuit in response to a rupture command RUPT_CMD which is toggling for a predetermined time. Each of the first to fourth anti-fuse circuits 120A, 120B, 120C, and 120D includes an anti-fuse to perform a respective rupture operation in response to a corresponding one of the first to fourth sequential rupture commands RUPT_<1:4>. For reference, the rupture command RUPT_CMD is synchronized with a clock signal (not shown), which is used in the semiconductor integrated circuit 100, and a period of the rupture command RUPT_CMD may be set to have N times of a period (tCK) of the clock signal, N being a natural number.

Hereinafter, since the anti-fuse circuits 120A to 120D have substantially the same structure, only the first anti-fuse circuit 120A is explained and shown for illustration purposes.

The first anti-fuse circuit 120A includes a voltage supply unit 122A and an anti-fuse 124A. The voltage supply unit 122A is configured to supply a high supply voltage VEXT in response to the first sequential rupture command RUPT_<1>, and the anti-fuse 124A is coupled between an output terminal of the voltage supply unit 122A and a low supply voltage VBBF terminal.

In detail, the voltage supply unit 122A includes an inverter INV1 and a PMOS transistor PM1. The inverter INV1 is configured to invert the first sequential rupture commands RUPT_<1>, and the PMOS transistor PM1 is configured to selectively couple a high supply voltage VEXT terminal to the output terminal of the voltage supply unit 122A in response to an output of the inverter INV1. Here, the high supply voltage VEXT and the low supply voltage VBBF are generated inside the semiconductor integrated circuit. For example, the high supply voltage VEXT may include a boosting voltage and the low supply voltage VBBF may include a back-bias voltage.

Figure 2:
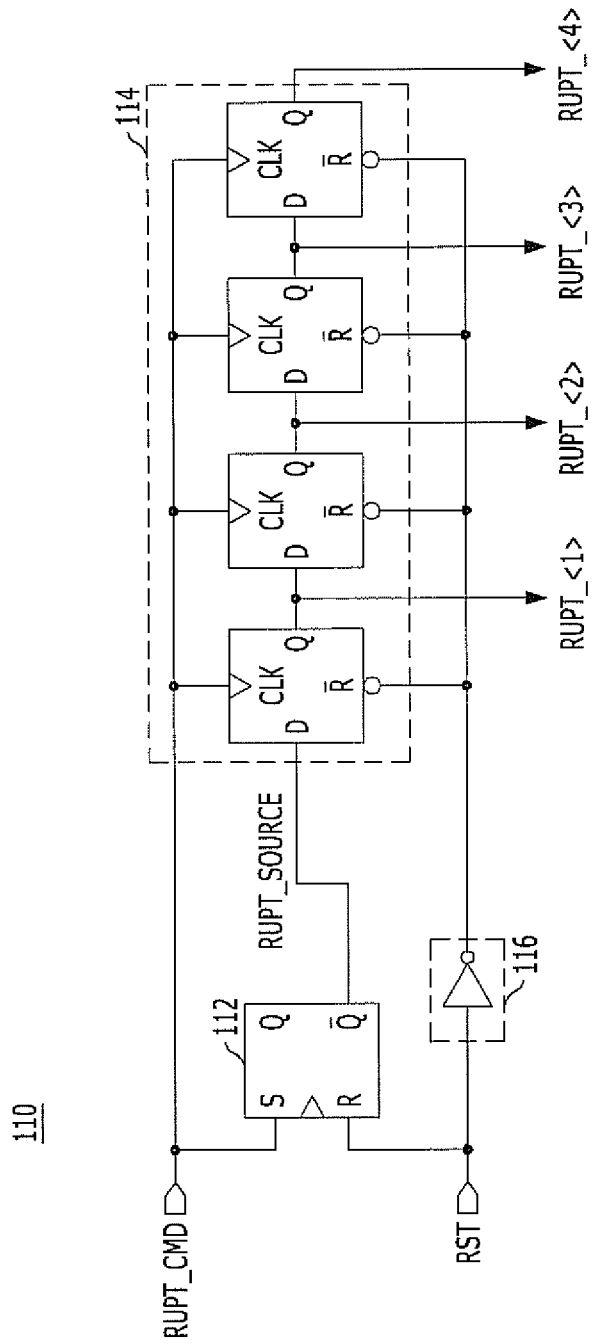
FIG. 2 shows a detailed circuit diagram of a sequential rupture command generating unit shown in FIG. 1.

FIG. 2 shows a detailed circuit diagram of the sequential rupture command generating unit 110 shown in FIG. 1.

Referring to FIG. 2, the sequential rupture command generating unit 110 includes a rupture source signal generating unit 112 and a sequential rupture command output unit 114. The rupture source signal generating unit 112 is configured to generate a rupture source signal RUPT_SOURCE in response to a reset signal RST and the rupture command RUPT_CMD. The sequential rupture command output unit 114 is configured to be reset in response to the reset signal RST and sequentially output the first to fourth sequential rupture commands RUPT_<1:4> in response to the rupture command RUPT_CMD and the rupture source signal RUPT_SOURCE.

The rupture source signal generating unit 112 may include a RS latch, and the sequential rupture command output unit 114 may include first to fourth D flip-flops which are coupled in series to be reset by an inverted reset signal. An inverter 116 may be provided to invert the reset signal RST to output the inverted reset signal.

Hereinafter, an operation of the semiconductor integrated circuit including the anti-fuse circuit in accordance with the exemplary embodiment is explained in detail.

Figure 3:
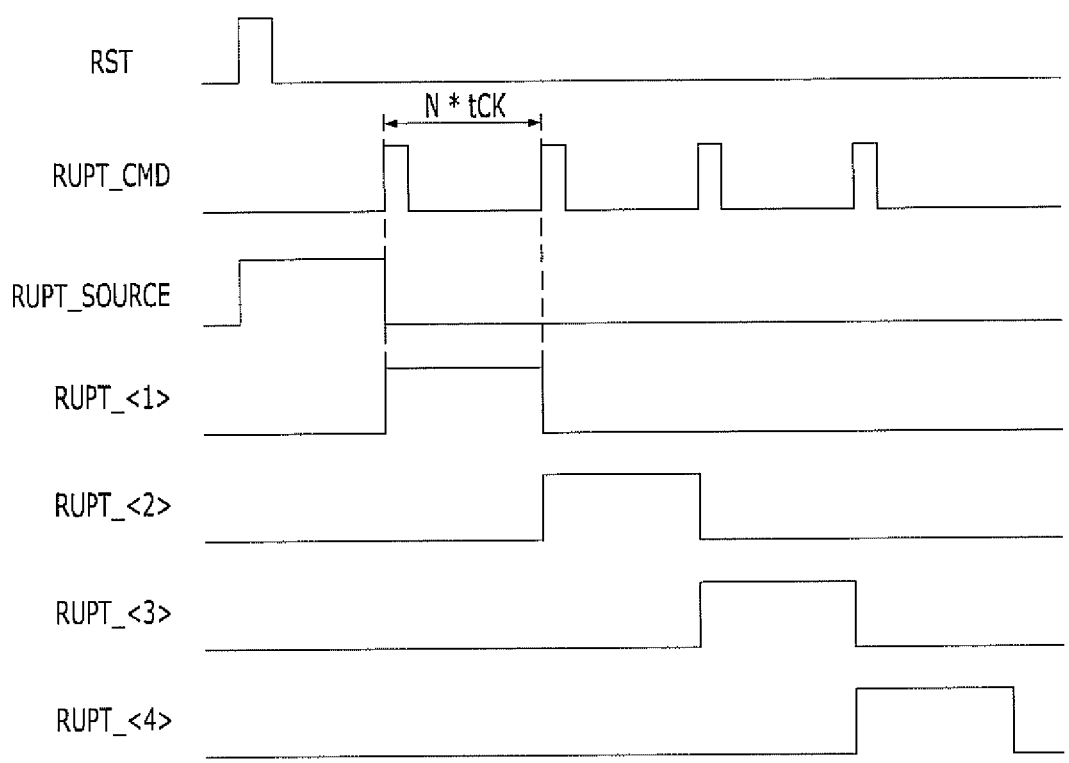
FIG. 3 is a waveform diagram illustrating an operation of the semiconductor integrated circuit including the anti-fuse circuit shown in FIG. 1.

FIG. 3 is a waveform diagram illustrating an operation of the semiconductor integrated circuit shown in FIG. 1.

Referring to FIG. 3, the rupture source signal generating unit 112 generates the rupture source signal RUPT_SOURCE in response to the reset signal RST and the rupture command RUPT_CMD which is toggling for a predetermined time from an activation of the reset signal RST.

Then, the sequential rupture command output unit 114 sequentially outputs the first to fourth sequential rupture commands RUPT_<1:4>, each indicating a section for a rupture operation of a corresponding anti-fuse circuit in response to the rupture command RUPT_CMD and the rupture source signal RUPT_SOURCE. At this time, a period of the rupture command RUPT_CMD is set to have N times of a period (tCK) of a clock signal (not shown), and the rupture source signal RUPT_SOURCE is sequentially shifted by the period of the rupture command RUPT_CMD, i.e., N*tCK, and outputted as the first to fourth sequential rupture commands RUPT_<1:4>. As a result, the first to fourth sequential rupture commands RUPT_<1:4> are sequentially activated in respond to a toggling of the rupture command RUPT_CMD and have an active duration corresponding to the period of the rupture command RUPT_CMD, i.e., N*tCK.

Accordingly, the anti-fuse circuits 120A to 120D rupture their own anti-fuse to perform a program operation in response to respective sequential rupture commands RUPT_<1:4>.

For reference, although one anti-fuse circuit is described to perform a program operation in response a rupture command in the exemplary embodiment, the present invention is not limited to this structure. For example, two or more anti-fuse circuits may perform a program operation in response a rupture command within unless a voltage level of high supply voltage may drop below a rupture tolerance range.

In accordance with the exemplary embodiments of the present invention, when a plurality of anti-fuse circuits is programmed at once, a semiconductor integrated circuit may ensure a section for a rupture operation of each anti-fuse circuit. Accordingly, reliability in the operation of the anti-fuse circuits may be increased for the program operation.

While the invention has been described with respect to the specific embodiments, it will be apparent to those skilled in the art that various changes and modifications may be made without departing from the spirit and scope of the invention as defined in the following claims.

What is claimed is:

1. A semiconductor integrated circuit, comprising:
    a command generating unit configured to generate a plurality of second commands in response to a first command, each second command for indicating an operation section of a corresponding anti-fuse circuit; and
    a plurality of anti-fuse circuits, each comprising an anti-fuse and configured to receive a corresponding second command and perform a rupture operation of the anti-fuse in response to the received corresponding second command,
    wherein the command generating unit comprises:
        a source signal generating unit configured to generate a source signal in response to a reset signal and the first command; and
        a sequential command output unit configured to be reset in response to the reset signal and configured to sequentially output the plurality of second commands in response to the first command and the source signal.

2. The semiconductor integrated circuit of claim 1, wherein the first command is toggling for a predetermined time in synchronization with a clock signal.

3. The semiconductor integrated circuit of claim 1, wherein the first command has a period which is set to have N times of a period of a clock signal, N being a natural number.

4. The semiconductor integrated circuit of claim 1, wherein the plurality of second commands is sequentially generated by shifting the first command.

5. The semiconductor integrated circuit of claim 1, wherein the source signal generating unit comprises a RS latch.

6. The semiconductor integrated circuit of claim 1, wherein the sequential command output unit comprises a plurality of D flip-flops coupled in series.

7. The semiconductor integrated circuit of claim 6, wherein the sequential command output unit further comprises an inverter configured to invert the reset signal to output an inverted reset signal to a reset signal input terminal of the D flip-flops.

8. The semiconductor integrated circuit of claim 1, wherein each of the anti-fuse circuits comprises:
    a voltage supply unit configured to supply a high supply voltage in response to the corresponding second command; and
    the anti-fuse coupled between an output terminal of the voltage supply unit and a supply terminal of a low supply voltage.

9. The semiconductor integrated circuit of claim 8, wherein the high supply voltage and a low supply voltage comprise a boosting voltage and a back-bias voltage generated inside the semiconductor integrated circuit.

10. The semiconductor integrated circuit of claim 1, wherein each of the anti-fuse circuits is configured to program the anti-fuse by supplying a high supply voltage to the anti-fuses during the corresponding operation section.

11. A method for driving a semiconductor integrated circuit, the method comprising:
    generating a rupture source signal in response to a reset signal and a first rupture command;
    sequentially generating a plurality of second rupture commands in response to the first rupture command and the rupture source signal, each indicating an operation section for programming a corresponding anti-fuse; and
    programming the corresponding anti-fuse in response to each of the second rupture commands.

12. The method of claim 11, wherein the first rupture command is toggling for a predetermined time from an activation of the reset signal.

13. The method of claim 11, wherein the first rupture command has a period which is set to have N times of a period of a clock signal, N being a natural number.

14. The method of claim 11, wherein the generating of the plurality of second rupture commands comprises:
    sequentially shifting the rupture source signal by a period of the first rupture command; and
    outputting the shifted signals as the second rupture commands.

15. The method of claim 11, wherein the second rupture commands are sequentially activated in respond to a toggling of the first rupture command and have an active duration corresponding to a period of the first rupture command.

16. The method of claim 11, wherein the programming of the anti-fuses comprises supplying a high supply voltage to the anti-fuses during the respective indicated operation sections.

* * * * *